United States Patent [19]
Okazaki

[11] Patent Number: 5,362,674
[45] Date of Patent: Nov. 8, 1994

[54] METHOD OF PRODUCING A MESA EMBEDDED TYPE OPTICAL SEMICONDUCTOR DEVICE INCLUDING AN EMBEDDED LAYER AT ITS SIDE WALL

[75] Inventor: Nirou Okazaki, Atsugi, Japan
[73] Assignee: Fujitsu Limited, Kawasaki, Japan
[21] Appl. No.: 721,575
[22] PCT Filed: Feb. 26, 1991
[86] PCT No.: PCT/JP91/00255
§ 371 Date: Aug. 2, 1991
§ 102(e) Date: Aug. 2, 1991
[87] PCT Pub. No.: WO91/13480
PCT Pub. Date: Sep. 5, 1991

[30] Foreign Application Priority Data
Feb. 28, 1990 [JP] Japan ................ 2-45854

[51] Int. Cl.$^5$ .............................. H01L 21/20
[52] U.S. Cl. ....................... 437/129; 437/126; 437/133; 437/228
[58] Field of Search ........... 437/129, 126, 133, 228

[56] References Cited

U.S. PATENT DOCUMENTS 4,662,998  5/1987  Renner .................. 437/129
4,797,374  1/1989  Scott et al. ............. 437/129

FOREIGN PATENT DOCUMENTS 54-96386    7/1979  Japan .
59-147478   8/1984  Japan .
60-115281A  6/1985  Japan .
61-256320A 11/1986  Japan .
1256178A   10/1989  Japan .

OTHER PUBLICATIONS

*Electronics Letters*, vol. 24, No. 24, 24 Nov. 1988, Stevenage, Herts, GB pp. 1483–1484.
*Journal of Applied Physics*, vol. 64, No. 7, 1 Oct. 1988, New York, US pp. 3684–3689.

*Primary Examiner*—R. Bruce Breneman
*Assistant Examiner*—R. Paladugu
*Attorney, Agent, or Firm*—Armstrong, Westerman, Hattori, McLeland & Naughton

[57] ABSTRACT

A method of producing a mesa embedded optical semiconductor device includes the following steps. A multilayer semiconductor structure is formed which includes a laser active layer and an adjoining layer, on a substrate. The multilayer semiconductor structure is selectively etched to form a mesa structure and expose a first planar surface around a root of the mesa structure. The mesa structure is formed to have a second planar surface which is orthogonal to a side wall of the mesa structure and is lower than a top surface of the mesa structure, and a planar side wall formed by a side wall of the laser active layer and a side wall of the adjoining layer. An embedded layer is formed, by vapor growth deposition, at the first planar surface, the second planar surface, and the planar side wall of the mesa structure, such that the embedded layer is free of voids.

7 Claims, 4 Drawing Sheets

METHOD OF PRODUCING A MESA EMBEDDED TYPE OPTICAL SEMICONDUCTOR DEVICE INCLUDING AN EMBEDDED LAYER AT ITS SIDE WALL

FIELD OF THE INVENTION

The present invention relates to an optical semiconductor device and method of producing the same and more specifically to a structure of an optical semiconductor device and a method of producing the same such as semiconductor laser providing a mesa structure, optical modulator, optical filter or photosensitive element.

A mesa embedded type optical semiconductor device is typically known as an example of the structure of optical semiconductor device.

This structure is formed by etching a multilayer structure of various semiconductor layers principally working as optical semiconductor device into the mesa type structure and then embedding both sides of such structure within a semiconductor layer for rejecting current.

The mesa embedded type optical semiconductor device must be produced in the stabilized high quality because it plays a very important role as the device for realizing an optical communication system or optical computer system.

PRIOR ART

FIG. 1 and FIG. 2 are diagrams indicating the mesa structure of the prior art through the sectional views of principal producing processes of a mesa embedded type InP system semiconductor laser.

In these figures, the reference numeral 1 denotes InP substrate; 2, active layer consisting of InGaAsP or InGaAs; 3, InP clad layer; 4, InGaAsP contact layer; 5, etching mask consisting of silicon dioxide.

The mesa type structure 10 is formed by etching a part of the contact layer 4, clad layer 3, active layer 2 and substrate 1 using the etchant consisting of bromme-thanol.

Moreover, the mesa type structure 10 shown in FIG. 2 is formed by etching a semiconductor layer formed by the InP material with chloric acid or hydrogen bromide and also etching a semiconductor layer formed by InGaAsP or InGaAs material with an etchant consisting of sulfuric acid system.

In FIG. 1 and FIG. 2, the flat area of substrate has the (100) plane.

In the structure shown in FIG. 1 and FIG. 2, both sides of mesa type structure 10 are embedded within the InP system semiconductor layer (current rejection layer) which defines a current path.

However, in the case of prior art shown in FIG. 1 and FIG. 2, a semiconductor layer is grown by the metalorganic chemical vapor deposition (MOCVD) method for embedding both sides of mesa structure and this growth layer is sometimes exposed out from the (111) B plane during the growing process.

The (111) B plane grows very slowly in the MOCVD method in comparison with that of the (100) plane forming the flat surface of the substrate and therefore when this plane is exposed, a problem that irregular growth areas or holes are generated in the grown semiconductor layer is generated.

FIG. 3 shows an example where both sides of mesa type structure 10 shown in FIG. 1 are embedded in the semiconductor layer 6. FIG. 4 also shows an example where both sides of mesa type structure 10 are embedded in the semiconductor layer 6 consisting of high resistance InP.

In the example where the structure of FIG. 1 is embedded in the semiconductor layer 6, irregular growth area 6A is generated as shown in FIG. 3.

Moreover, in the example where the structure of FIG. 2 is embedded in the semiconductor layer 6, holes 6B are generated as shown in FIG. 4.

The structures shown in FIG. 3 and FIG. 4 show the examples where normal growth is disabled due to exposition of the (111) B plane in the course of the growth.

After completion of embedded growth, golde, for example, is deposted as the electrode material.

However, gold easily diffuses into semiconductor material and it is necessary to deposit the TiPt layer as a barrier layer, etc. prior to the deposition of gold. Therefore, since it is difficult to deposit the barrier layer on the abnormally grown complicated region in FIG. 3 or in the hole region in FIG. 4, gold is deposited in direct in such regions.

The region where gold is deposited in direct allows formation of a conductive path by diffusion of gold and accordingly a leak current is easily generated and good performance cannot be obtained.

OBJECT AND DISCLOSURE OF THE INVENTION

It is a first object of the present invention to provide a mesa embedded type optical semiconductor device providing a structure that exposition of the (111) B plane which causes irregular growth at the time of embedding both sides of mesa type structure may be suppressed.

It is a second object of the present invention to provide a mesa embdedded type optical semiconductor device which enables suppression of exposition of the (111) B plane at the time of embedding both sides of the mesa type structure.

In order to realize the first object, the present invention provides a mesa embedded type optical semiconductor device comprising a semiconductor substrate, a multiplayer semiconductor layer of the mesa type structure located on the first plane on the semiconductor substrate and is provided with the second plane in the lateral direction of side wall and an embedding layer embedding the first and second planes and side surface of mesa type multilayer semiconductor layer.

Moreover, in order to realize the second object, the present invention provides a method of producing the mesa embedded type optical semiconductor device comprising the steps for;

forming a multiplayer semiconductor layer to structure an optical semiconductor device on the semiconductor substrate, forming the multilayer semiconductor layer of the mesa type structure being located on the first plane and having the second plane in the lateral direction of side wall by selectively etching the multilayer semiconductor layer, and forming, by the vapor growth deposition, the embedded layer at the first and second planes and the side wall of the multiplayer semiconductor layer of the mesa type structure.

PREFERRED EMBODIMENT OF THE INVENTION

Embodiment 1

Figure 5:
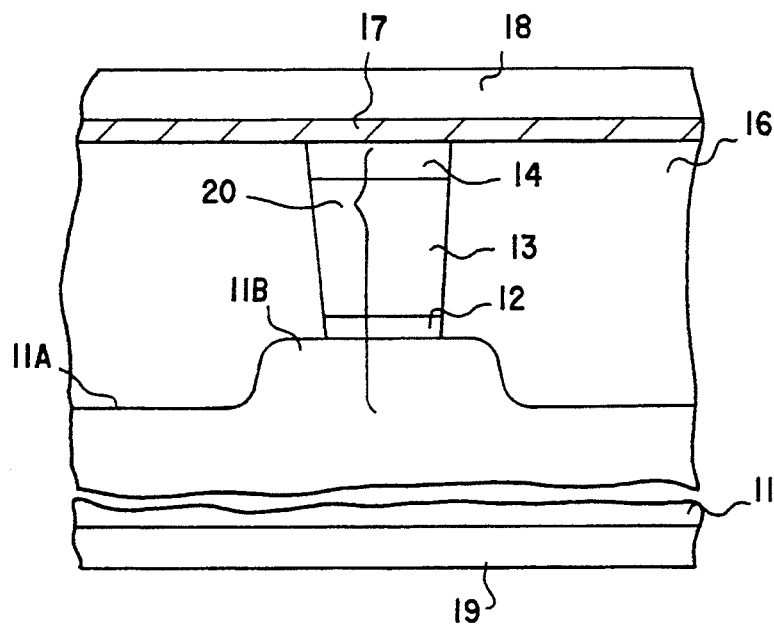
FIG. 5 is a diagram of a first embodiment indicating the basic structure of the present invention.

FIG. 5 is a diagram for explaining the first embodiment of the present invention.

FIG. 5 shows a sectional view of the first embodiment wherein the present invention is applied to a InP system semiconductor laser.

In this figure, the reference numeral 11 denotes InP substrate; 11A, first plane on the substrate; 11B, second plane on the substrate; 12, InGaAsP active layer; 13, InP clad layer; 14, InGaAsP electrode contact layer; 16, embedded layer consisting of InP; 17, barrier layer consisting of TiPt; 18, gold electrode layer; 19, electrode layer at the rear side; 20, mesa type structure.

As will be obvious from FIG. 5, in this embodiment, the first plane 11A is provided on the substrate 11, moreover a multilayer semiconductor layer consisting of substrate 11, active layer 12, clad layer 13 and contact layer 14 is formed as the mesa type structure 20 and the second plane is provided at the higher area than the first plane 11A on such mesa type structure 20.

Both first plane 11A and second plane 11B have the plane index number (100).

In case the embedded layer 15 is formed for such structure with the metalorganic chemical vapor deposition (MOCVD) method, irregular growth or holes, which have been observed in the prior art, are not generated as is apparent from FIG. 5. This fact has been confirmed experimentally.

Although details of mechanism of no generation of irregular growth and holes are not yet analyzed clearly, the plane index number to form the first and second planes is considered very important.

Namely, in this embodiment, the first and second planes are formed with the (100) plane index number, but this (100) plane may be easily grown by the MOCVD method and has the property against that of the (111) B plane.

Since these first and second planes are located in different heights, film is considered to be deposited first from these two kinds of planes in the initial stage of growth.

In the prior arts, the (100) plane is formed only at the flat surface of substrate and the (111) B plane may be assumed to easily appear because the growth mainly occurs from such plane as the growth initiation plane.

On the other hand, in the embodiment of the present invention, the (100) plane as the growth initiation plane is divided into two stages and growth occurs individually from the respective planes. Therefore, such main growth is considered difficult and appearance of the (111) B plane is considered to be suppressed.

When the layer 16 is embedded as required as indicated in the embdodiment, the barrier layer to be formed thereafter can be uniformly deposited to the entire surface of plane and the gold electrode to be formed next will not be deposited in direct on the multilayer semiconductor layer and thereby a problem of leak current occurring in the prior arts may be solved.

In an alternative, a plurality of similar planes may be provided in place of the first and second planes.

Moreover, these planes are provided on the substrate 11 forming a part of the mesa type structure 20 in this embodiment, but it is also enabled to provide such planes on the other layers forming the mesa type structure 20 such as active layer 12, clad layer 13 and electrode contact layer 14.

Embodiment 2

Figure 1:
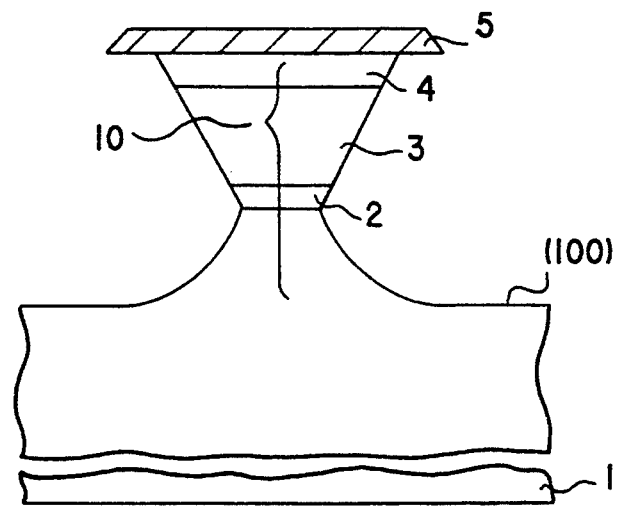
FIG. 1 to FIG. 4 are diagrams for explaining prior arts of the present invention.
Figure 2:
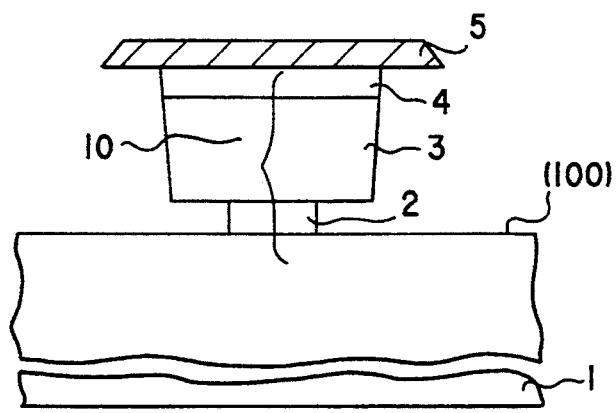
Figure 3:
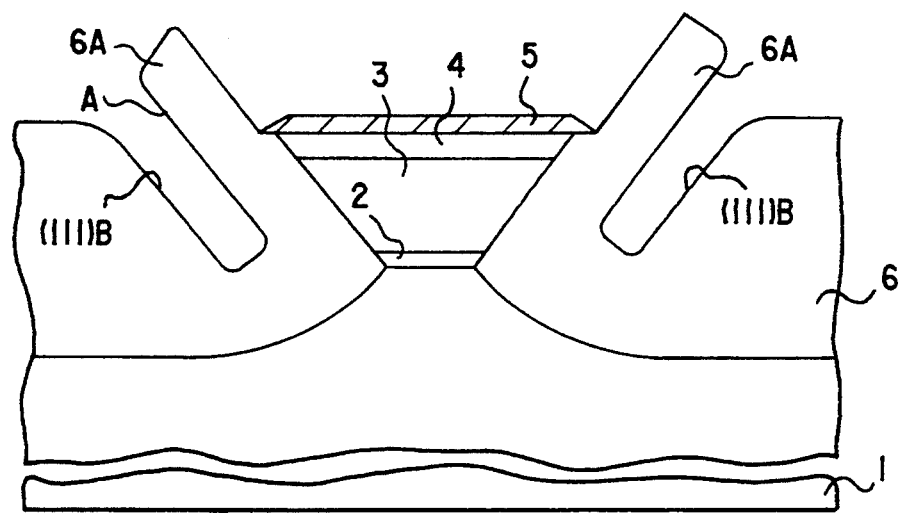
Figure 4:
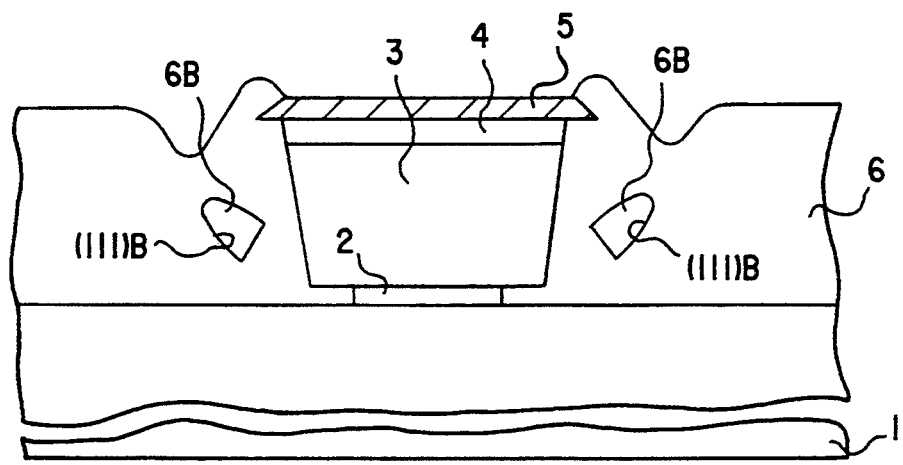

FIG. 6 to FIG. 10 are diagrams for explaining the second embodiment of the present invention. The elements similar to those in FIG. 1 are designated by the like reference numerals.

Figure 6:
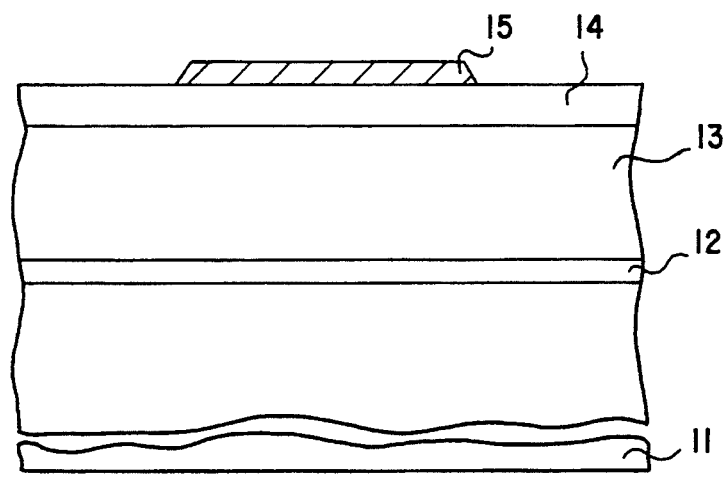
FIG. 6 to FIG. 10 are diagrams for explaining a second embodiment indicating the producing processes of the present invention.

Referring to FIG. 6

For example, using the MOCVD method, the active layer 12, clad layer 13 and electrode contact layer 14 are sequentially grown on the n-type InP substrate 11 having the plane index number of (100).

The principal conditions of each growth layer is for example as follow.

1. For substrate 11:
   Impurity: S or Sn
   Impurity concentration: $5 \times 10^{18}$ (cm$^{-3}$)
2. For active layer 12:
   Material: non-doped InGaAsP
   Luminescence peak wavelength: 1.3 ($\mu$m)
   Thickness: 0.15 ($\mu$m)
3. For clad layer 13:
   Material: p-type InP
   Impurity: Cd or Zn
   Impurity concentration: $7 \times 10^{17}$ (cm$^{-3}$)
   Thickness: 1.5 ($\mu$m)
4. For electrode contact layer 14:
   Material: P-type InGaAsP
   Impurity: Cd or Zn
   Impurity concentration: $1 \times 10^{19}$(cm$^{-3}$)
   Thickness: 0.3 ($\mu$m)

Thereafter, using the chemical vapor deposition method, a silicon dioxide layer 15 is grown in the thickness of about 1000(Å).

Moreover, silicon dioxide may be replaced with silicon nitride or aluminum oxide.

Next, the patterning of silicon dioxide film 15 is executed by applying the resist process utilizing ordinary photolithograry and the reactive ion etching (RIE) method where trichloromethane (CHF$_3$) is used as the eetching gas.

This patterning is executed so that the silicon dioxide film 15 extends in the direction of <011> of the substrate 11 and is striped in the width of about 3–4 ($\mu$m).

Figure 7:
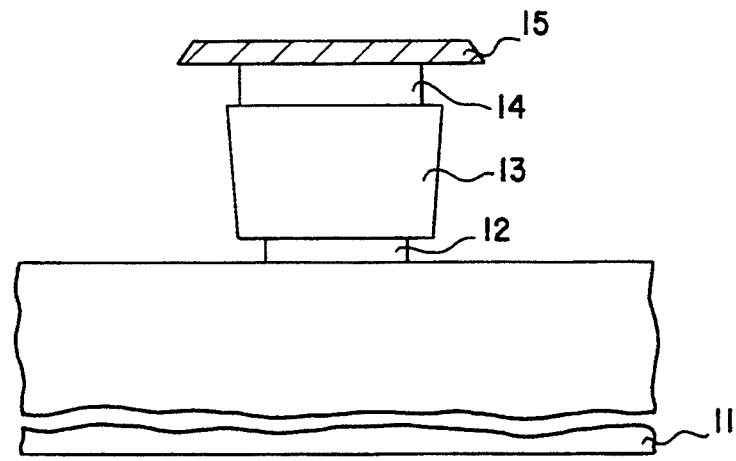

Referring to FIG. 7

The patterning of electrode contact layer 14 may be executed using the silicon dioxide film 15 used as the mask by applying the wet etching method utilizing the etchant of sulfuric acid.

Next, the etching is carried out utilizing the etchant of hydrochloric acid system and the clad layer 13 is selectively etched with the patterned electrode contact layer 14 used as the mask.

Next, the etching is executed utilizing the etchant of sulfuric acid and the active layer 14 is selectively etched with the patterned clad layer 13 used as the mask.

In this timing, quantity of side etching of active layer 14 is controlled by adjusting the etching time and thereby the width of active layer 14 can be controlled.

Figure 8:
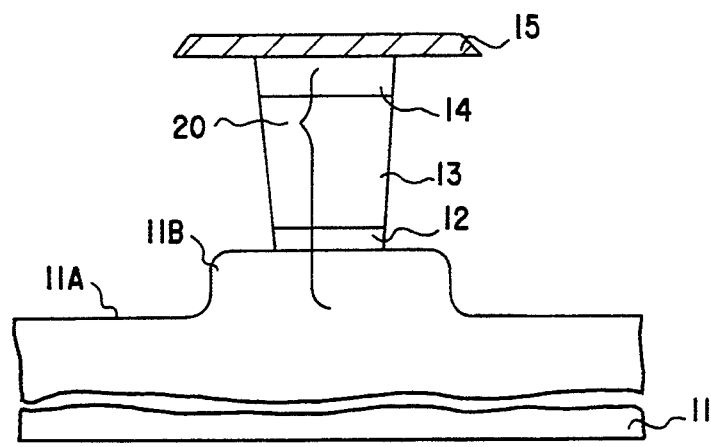

Referring to FIG. 8

A stepped portion is formed on the substrate 11 by the etching utilizing etchant of $HCl+HNO_3+H_2O_2$.

In this process, the first plane 11A is formed on the semiconductor substrate 11, the clad layer 13 is also side-etched in the laterial direction at the time of this etching and the side surface draws back to the surface continued to the electrode contact layer 14 and active layer 12, exposing the second plane 11B.

With the process mentioned above, the mesa type structure 20 consisting of multiplayer structure of the substrate 11, active layer 12, clad layer 13 and electrode contact layer 14 is formed.

Figure 9:
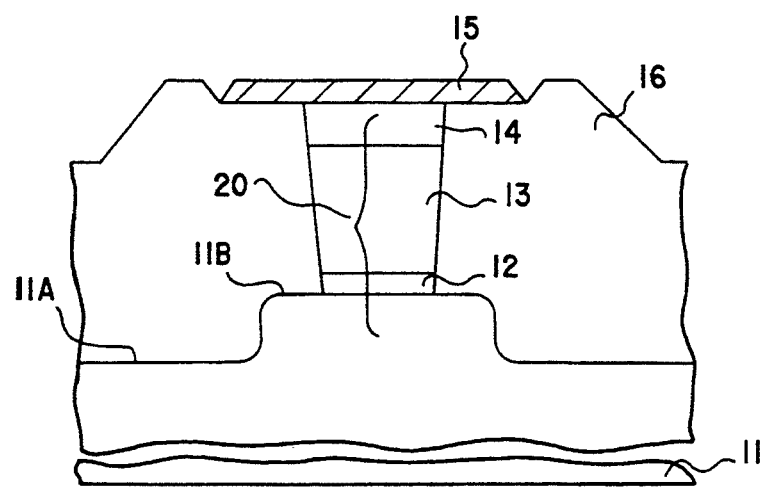

Referring to FIG. 9

Next, an embedded layer 16 is formed by utilizing MOCVD method.

The embedded layer 15 does not grow on the region where the silicon dioxide film 15 is formed.

The embedded layer 16 has for example the following conditions.

Material: InP
Impurity: Fe
Impurity concentration: $7 \times 10^{16}$ (cm$^{-3}$)

The embedded layer 16 contains Fe which will become impurity to form a deep level (deep acceptor) and works as a high resistance layer. Therefore, current is limited to be injected only to the mesa structure region.

The embedded layer 16 starts growth from the first plane 11A and second plane 11B and is suppressed to allow appearance of the (111) B plane during the growth. Accordingly, irregular growth or holes are never generated.

The embedded layer may not only be the layer forming the PN reverse bias junction (for example, laminated structure of the N type layer and P type layer), in addition to high resistance layer explained above, but also combination of high resistance layer and PN reverse bias junction (for example, the structure where the embedded layer is formed by high resistance layer and N type layer and the P type layer is laminated thereon).

Figure 10:
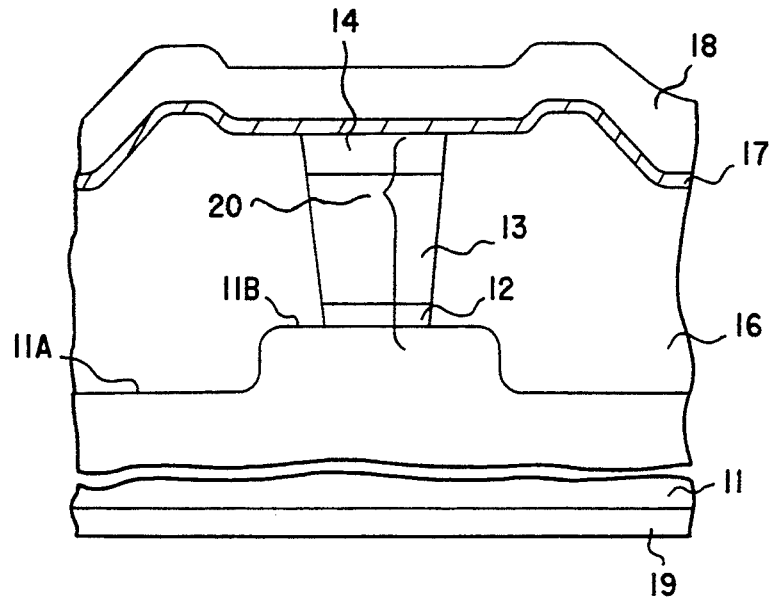

Referring to FIG. 10

Next, after removing the silicon dioxide film 15 utilizing the etchant of HF system, a barrier layer 17, gold electrode 18 are formed and a rear surface electrode layer 19 is also formed to the rear surface of the substrate 11 to complete a semiconductor laser.

Each electrode has for example the following conditions.

For barrier layer 17:
  Material: laminated material of Ti and Pt
  Thickness: Ti=1000Å, Pt=3000Å
For gold electrode 18:
  Thickness: 3 μm
For rear surface electrode layer 19:
  Material: laminated material of Au and Au/Ge alloy
  Thickness: Au=2500Å, Au/Ge=500Å

The mesa type embedded semiconductor laser formed by the processes explained above is controlled in generation of irregular growth and holes. Therefore, such a fear as generating lead current due to diffusion of gold electrode 18 into semiconductor layer can be dissolved.

In above embodiment, the present invention has been applied to a structure of the semiconductor layer, but the present invention allows, as multiplicity of alternateives, application into a variety of optical semiconductor device by modifying organization of a multilayer semiconductor layer of the mesa structure.

For instance, an optical modulator may be realized by forming the active layer 12 of the multilayer semiconductor layer forming the mesa type structure with InGaAsP which absorbs the light of 1.3 μm where λ is 1.55.

Moreover, an optical filter can also be realized by forming the active layer 12 with a semiconductor layer which absorbs the particular light in such a structure as similar to optical modulator.

In addition, a photosensitive element can also be realized by forming the active layer 12, for example, with the InGaAs light absorbing layer.

The alternatives explained above are only examples and any type of optical semiconductor device employing the mesa type embedded structure allows application of the present invention.

I claim:

1. A method of producing a mesa embedded optical semiconductor device, comprising the steps of:
   forming a multilayer semiconductor structure which includes a laser active layer and an adjoining layer adjoined with said laser active layer, on a substrate;
   selectively etching said multilayer semiconductor structure to form a mesa structure and expose a first planar surface around a root of the mesa structure, said mesa structure having, a second planar surface which is orthogonal to a side wall of the mesa structure and is lower than a top surface of the mesa structure, and a planar side wall formed by a side wall of said laser active layer and a side wall of said adjoining layer, and
   forming, by vapor growth deposition, an embedded layer at said first planar surface, said second planar surface, and said planar side wall of said mesa structure, such that said embedded layer is free of voids.

2. The method of producing a mesa embedded optical semiconductor device according to claim 1, wherein said first planar surface is exposed by simultaneously etching the substrate surface when selectively etching said multilayer semiconductor layer.

3. The method of producing a mesa embedded optical semiconductor device according to claim 2, wherein said second planar surface is the substrate surface exposed when said multilayer semiconductor layer draws back when the side etching is executed after selectively etching said multilayer semiconductor layer.

4. The method of producing a mesa embedded optical semiconductor device according to claims 1 to 3, wherein said embedded layer is formed by the metalorganic chemical vapor deposition method.

5. A method of producing a mesa embedded optical semiconductor device, comprising the steps of:
   forming a multilayer semiconductor structure which includes a laser active layer and an adjoining layer adjoined with said laser active layer, on a substrate;
   selectively etching said multilayer semiconductor structure to form a mesa structure and expose a first planar surface around a root of the mesa structure, said mesa structure having, a second planar surface which is orthogonal to a side wall of the mesa structure and is lower than a top surface of the mesa structure, and a planar side wall formed by a side wall of said laser active layer and a side wall of said adjoining layer, and forming, by vapor growth deposition, an embedded layer at said first planar surface, said second planar surface, and said planar side wall of said mesa structure, such that said embedded layer is free of voids;

wherein said embedded layer is composed of InP which is grown on said first and second planes which have the surface index number (100).

6. A method of producing a mesa embedded optical semiconductor device, comprising the steps of:

forming a multilayer semiconductor structure which includes a laser active layer and an adjoining layer adjoined with said laser active layer, on a substrate;

selectively etching said multilayer semiconductor structure to form a mesa structure and expose a first planar surface around a root of the mesa structure, said mesa structure having, a second planar surface which is orthogonal to a side wall of the mesa structure and is lower than a top surface of the mesa structure, and a planar side wall formed by a side wall of said laser active layer and a side wall of said adjoining layer, and forming, by vapor growth deposition, an embedded layer at said first planar surface, said second planar surface, and said planar side wall of said mesa structure, such that said embedded layer is free of voids;

wherein said embedded layer is a current contracting layer for injecting a current only to said multilayer semiconductor layer.

7. The method of producing a mesa embedded optical semiconductor device according to claim 6, wherein said embedded layer is a high resistance semiconductor layer.

* * * * *